(12) United States Patent
Kushihashi et al.

(10) Patent No.: US 10,080,259 B2
(45) Date of Patent: Sep. 18, 2018

(54) THREE-DIMENSIONAL CERAMIC HEATER

(71) Applicant: SHIN-ETSU CHEMICAL CO., LTD., Tokyo (JP)

(72) Inventors: Takuma Kushihashi, Annaka (JP); Noboru Kimura, Annaka (JP); Kazuyoshi Tamura, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 800 days.

(21) Appl. No.: 14/451,995

(22) Filed: Aug. 5, 2014

(65) Prior Publication Data

US 2015/0053667 A1    Feb. 26, 2015

(30) Foreign Application Priority Data

Aug. 21, 2013 (JP) ................. 2013-170963

(51) Int. Cl.
| | |
|---|---|
| *H05B 3/08* | (2006.01) |
| *H05B 3/14* | (2006.01) |
| *C23C 14/14* | (2006.01) |
| *C23C 14/24* | (2006.01) |
| *H05B 3/48* | (2006.01) |
| *C23C 14/26* | (2006.01) |
| *H05B 3/26* | (2006.01) |

(52) U.S. Cl.
CPC ............ *H05B 3/141* (2013.01); *C23C 14/14* (2013.01); *C23C 14/243* (2013.01); *C23C 14/26* (2013.01); *H05B 3/265* (2013.01); *H05B 3/48* (2013.01); *H05B 2203/002* (2013.01)

(58) Field of Classification Search
CPC ....... C23C 14/14; C23C 14/243; C23C 14/24; H05B 3/48; H05B 3/141; H05B 3/14
USPC ............................ 427/250, 248.1; 219/541
See application file for complete search history.

(56) References Cited

FOREIGN PATENT DOCUMENTS

| JP | 2001-006854 A | 1/2001 |
|---|---|---|
| JP | 2001-176646 A | 6/2001 |
| JP | 2001176646 | * 6/2001 |
| JP | 2001-342071 A | 12/2001 |
| JP | 2001342071 | * 12/2001 |
| JP | 2007-262478 A | 10/2007 |

OTHER PUBLICATIONS

Office Action dated Dec. 24, 2015, issued in counterpart Japanese Patent Application No. 2013-170963, with English translation. (7 pages).

* cited by examiner

*Primary Examiner* — Dana Ross
*Assistant Examiner* — Joseph Iskra
(74) *Attorney, Agent, or Firm* — Westerman, Hattori, Daniels & Adrian, LLP

(57) ABSTRACT

A three-dimensional ceramic heater, such as a cylindrical ceramic heater, is proposed in which the conductive ceramic heating element is multi-furcated into lanes at least in the folded-back sections so that the electric current tends to flow in a more uniform and hence laminar manner with the effect that the localized over heating is suppressed greatly.

7 Claims, 9 Drawing Sheets

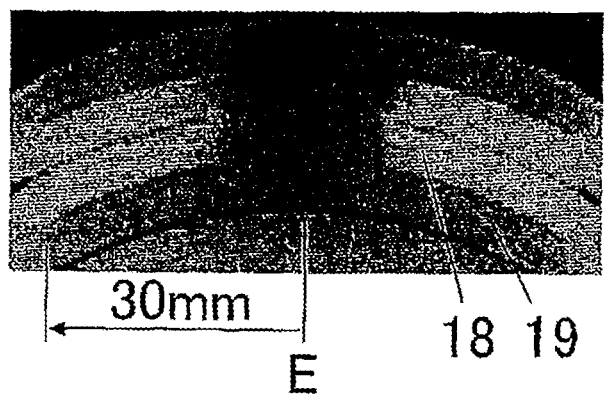
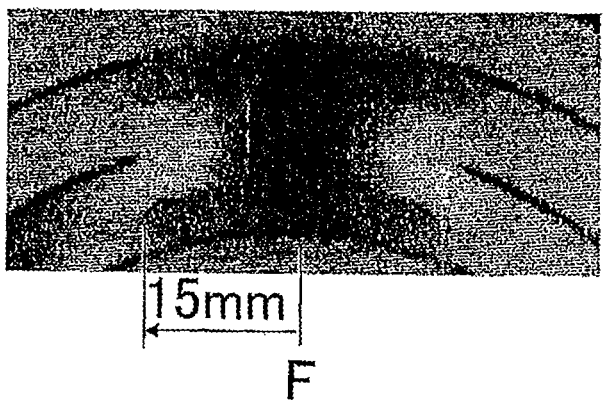
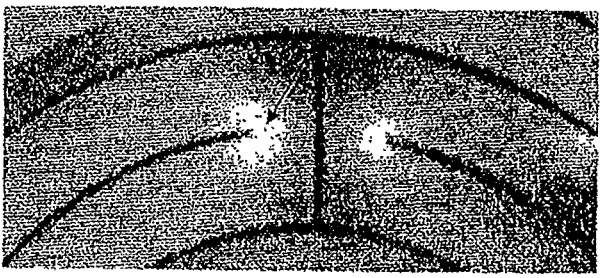
Fig. 9

THREE-DIMENSIONAL CERAMIC HEATER

PRIORITY CLAIMED

The present non-provisional application claims priority, as per Paris Convention, from Japanese Patent Application No. 2013-170963 filed on Aug. 21, 2013, the disclosure of which is incorporated by reference herein in its entirety.

FIELD OF THE TECHNOLOGY

The present invention relates to a three-dimensional ceramic heater used for heating a crucible holding a raw material in a vacuum deposition apparatus used for manufacturing of semiconductor, solar cell, organic EL display, etc.

BACKGROUND TECHNOLOGY

Vacuum deposition method is known as one of the procedures for forming a thin film, and this vacuum deposition method consists of steps of placing raw material(s) for deposition in a crucible, heating the crucible to a temperature above the vaporization point of the deposition material in the vacuum deposition apparatus to thereby create the vapor of the deposition material, and depositing the substance on a substrate to thereby form a thin layer. As a method for heating the crucible, resistance heating, electron beam heating, high frequency induction heating or the like have been used, but among them the resistance heating is well known wherein heating element consisting of tantalum wire or tungsten wire is held outside the crucible by an electrically insulating device in a manner such that the heating element is wound about the crucible's outer periphery (IP Publication 1).

However, in the case of the resistance heating method of IP Publication 1, the heating element has no cladding layer so that the conductor is exposed when in use and thus there is a fear of discharge of electricity and short circuit. Also, as the heating element is heated to high temperatures, the heating element is apt to undergo degradation through embrittlement and dissipation with a possible consequence of wire breakage.

On the other hand, IP Publication 2 teaches about a ceramic heater, according to which a supporting base body made of pyrolytic boron nitride (PBN) by chemical vapor deposition method is coated with a electrically conductive thin layer of pyrolytic graphite (PG) by means of chemical vapor deposition method, and then by machining this PG layer a desirously patterned heating element is obtained, and this heating element is paved with a pyrolytic boron nitride insulating layer by means of chemical vapor deposition method, and hence the ceramic heater (PG/PBN heater) is made.

The ceramic heater of IP Publication 2 has its heating element paved with insulating layer so that there is no fear of discharge of electricity and short circuit, and also since the supporting base body, the heating element and insulating layer are all made by chemical vapor deposition method, the ceramic heater has a relatively high purity and scarcely releases impurities.

However, this ceramic heater is a flat plate-type heater used for uniformly heating a base plate to make a semiconductor wafer or a thin film so that it is not possible to use this ceramic heater as it is for the application of heating a raw material-holding crucible in a vacuum deposition apparatus. Also, even when it is used for heating a raw material-holding crucible to a temperature of 1000 degrees centigrade or higher, the heater pattern of the ceramic heater is such that an electric current passing a folded-back section of the heater pattern tends to converge toward the inner corner so that the vicinity of the inner periphery of the folded-back section is locally heated to an extra higher temperature than the outer periphery thereof, and consequently a problem exists that for a long term use the heater cannot be expected to perform stably and durably.

IP Publication 3 describes a ceramic heater wherein the folded-back section of the heater pattern is divided into a number of lanes that run along the direction of the electricity flow passage in order to solve the said problem of uneven electricity flow had by the conventional flat plate-type heater. However, the thus improved ceramic heater is designed to uniformly heat a flat plate body, so that it is not suitably used in heating a three-dimensional raw material-holding crucible to a heightened temperature. Also, there is no teaching in IP Publication 3 as to whether or not the improved ceramic heater can withstand a long term use wherein the raw material-holding crucible is heated to a temperature of 1000 degrees centigrade or higher.

PRIOR ART DOCUMENTS

IP Publications

[IP Publication 1] Japanese Published Patent Application 2007-262478
[IP Publication 2] Japanese Published Patent Application 2001-6854
[IP Publication 3] Japanese Published Patent Application 2001-342071

DISCLOSURE OF THE INVENTION

Problems the Invention Seeks to Solve

It is noted by the way that there have been used ceramic heaters made of PG and PBN which have a three-dimensional build such as cylindrical, in addition to ones having a flat plate build. For example, in the case of making a three-dimensional PG/PBN ceramic heater having a cylindrical contour, the making of the heater pattern is conducted by methods such as: using a machine tool such as machining center together with an end milling cutter having a flat end or a global ball end to cut the deposited conductive film layer into a desired pattern; or applying a mask with a desired pattern cut away to the conductive film layer and applying sand blasting to remove unnecessary sections of the conductive film layer.

However, a three-dimensional PG/PBN ceramic heater made in a manner such as these has a problem that the working life tends to be short when used to heat a raw material-holding crucible in a vacuum deposition apparatus wherein the heating temperature is as high as a thousand and several hundred degrees centigrade, and hence we will explain about this problem in detail using drawings.

First, the problem arising from the heater pattern will be explained. FIG. 6 (*a*) is a plan view of a cylindrical PG/PBN ceramic heater as viewed from the top, and FIG. 6 (*b*) is a side view of the cylindrical PG/PBN ceramic heater as viewed from a side. Then FIG. 7 is an unfolded view of the cylindrical PG/PBN ceramic heater, showing the pattern of the ceramic heater.

The shape of this pattern of the ceramic heater consists of grooves 2*a* and the heating element 2*b* which define the current conduits. The grooves 2a is formed by subjecting the pyrolytic graphite (PG) conductive film layer deposited over the supporting base of pyrolytic boron nitride (PBN) to machining with a device such as end mill or to sand blasting, followed by removal of unnecessary parts of conductive film layer to give rise to the grooves 2a; the PG conductive film layer that is left on the supporting base becomes the heating element 2b. One end of the thus created heating element 2b is provided with an electricity supply terminal 1, and the electric current that starts from this electricity supply terminal 1 flows along the heating element (passage) 2b, turning around at the folded-back sections 3 of the heater pattern, and reaches another electricity supply terminal 1 provided at an end of the heating element 2b on the opposite side of the cylinder body.

FIG. 8 is an enlarged view of a folded-back section of the heater pattern. In FIG. 8, the broken lines curved in semi-elliptic shape indicate courses that electricity takes in the heating element 2b. As shown in FIG. 8, in the folded-back section 3 of the heater pattern, the current tends to concentrate toward the inner corner 4 so that the phenomenon of localized heating takes place in the vicinity of the inner corner 4 of the folded-back section 3. This is caused by a characteristic of electric current that the current takes a course more selectively if it has a lower resistivity. Then, the closer a course is to the inner corner 4 of the folded-back section 3, the shorter the length of the course becomes so that its resistance is smaller and thus the electricity current concentrates in the vicinities of the inner corner 4 of the folded-back section 3; hence the problematic localized heating occurs at as many locations as the number of the folded-back section 3 of the heating element 3a.

Next, we will explain about a problem which accompanies the manufacture of a cylindrical ceramic heater. In the case of manufacturing a cylindrical ceramic heater, if the irregularity in the diameter of the cylindrical outer side face of the supporting base body is large, when the PG conductive thin film on the outer side face of the supporting base body is machined by end mill to produce the heater pattern, the edge of the end mill would either enter too deep into the supporting base body to form a overly deep groove or enter too shallow into the supporting base body to form a overly shallow groove; at locations where the end mill has entered too deep, the groove becomes overly deep and thus the PBN insulating layer which is formed over the heater pattern becomes easier to detach there with a consequence that as the temperature of the heater is heightened, the detachment occurs more promptly from the overly deepened grooves.

This kind of manufacturing problem is also experienced when the heater pattern is formed by machining with a ball end mill. In the case of using a ball end mill, since the edge is spherical in shape, when the edge enters the supporting base body too deep, the groove becomes wider making the width of the adjacent heating element smaller as much giving rise to a localized heating area. In order to solve this kind of problem, there is known a so-called profile machining by which the movement of the cutting tool is controlled in response to the variation of the diameter of the supporting base body so as to make constant the depth by which the edge of the end mill enters the supporting base body; however the profile machining makes the machining tool overly expensive.

Also, if the irregularity in the diameter of the cylindrical outer side face of the supporting base body is large, when a heater pattern is made in a manner such that a mask cut in a desired heater pattern is applied to the surface of the PG conductive thin film and sand is blasted upon the mask to thereby grave out the heater pattern, it is difficult to apply the mask without distortion so that the resulting width of the heating element may be greater at some parts and smaller at others or the width of the groove may be greater at some parts and smaller at others, with a consequence that the problematic localized heating may occur at those parts of the heating element which have smaller widths. In addition to this, the possibility of incurring a short circuit at the parts where the width of the groove is smaller becomes higher, and since in this situation the neighboring heating bodies are closer to each other the percentage by which the heating bodies occupy the area is higher than normal and at the same time the percentage by which the groove occupies the area is lower than normal so that the problematic localized heating is more likely to occur.

Next, we will explain the problems that accompany such localized heating and choice of materials for the heater. In a process wherein a film of an inorganic material or metal is formed by means of vacuum deposition method, the process requires a heating to as high as one thousand and several hundred degrees centigrade. For example, such heating temperature is required when Cu is used as the vapor source, and if a PG/PBN ceramic heater is adopted in this application, the ceramic heater is raised to a temperature of about 1300 degrees centigrade. And at the locally extra heated areas such as the folded-back sections of the heater pattern and the cylindrical outer side face of the supporting base body the temperature is raised still higher. PBN, which is one of the materials to make the ceramic heater, is relatively stable; but it starts infinitesimal self decomposition when the temperature reaches 1300 degrees centigrade or so, and the higher the temperature becomes, the quicker this self decomposition proceeds so that if above-mentioned locally extra heated areas exist in the ceramic heater, the insulating layer wears more quickly at those locally extra heated areas.

Also, if oxygen or moisture exists in a vacuum chamber, the oxygen and the moisture would cause oxidization and wear of the PBN at high temperatures, and the higher the temperature is, the quicker the oxidation of the PBN proceeds, so that the oxidation and the wear of the insulating layer occur more progressively at the locally extra heated areas.

If such self decomposition and oxidative wear of the PBN occur continuously for a long period of time, the insulating layer at the inner corner of the folded-back section of the heater pattern would be completely consumed to expose the heating element, followed by scattering and consumption of the heating element, and then the heating element would be broken apart.

When there exist apart from each other the locally extra heated parts caused by the electricity current concentrating toward the inner corner in the folded-back section of the heater pattern and the locally extra heated parts caused by the irregularity in diameter of the support base body, the detachment of the insulating layer of the PBN and the consumption of the PBN itself are triggered and prompted at the locally extra heated parts during the heating process wherein the temperature is raised to as high as a thousand and several hundred degrees centigrade, so that the life span of the ceramic heater tends to be unsatisfactory.

Hence the goal of the present invention is to solve the above-described problems accompanying a three-dimensional ceramic heater, and thus to provide a three-dimensional ceramic heater for heating a raw material-holding crucible in a vacuum deposition apparatus that has a long life.

The present inventors conducted intensive research in order to attain the goal and found: that if the heater pattern described in the above-named IP Publication 3 is applied to a three-dimensional ceramic heater for heating a raw material-holding crucible, it is possible to substantially remove the locally extra heated part in the folded-back section of the heater pattern that adversely affects the life span of the heater; and that if the electric power density in the respective divided electric current lane is restricted within a range of plus/minus 30% of the average value of the electric power densities of all lanes, then there occurs no outstandingly high temperature heating in any particular divided electric current lane so that it becomes rare that temperature irregularity occurs among the divided electric current lanes, with a result that the life of the ceramic heater is significantly extended—hence the possession of the present invention.

Means to Solve the Problems

In other words, the present invention provides a three-dimensional ceramic heater having; a three-dimensional supporting base body made of an electrically insulating ceramic; a thin film heating element made of a conductive ceramic, which is laid on the supporting base body and is cut in a heater pattern including fold-back sections; an insulating layer made of an electrically insulating ceramic, which is laid on the heating element; and power supply terminals for connecting the heating element to the power source; the improvement comprises in that each folding-back section is divided into a plurality of electric current lanes which extend in the directions of the electric current passage and in that when the folded-back section is divided into N electric current lanes (N being two or more), the electric power density Xn in an nth electric current lane satisfies the following Inequality 1 (n being 1 through N).

$$0.7 \leq \frac{X_n}{\frac{\sum_{n=1}^{N} X_n}{N}} \leq 1.3$$ [Inequality 1]

Also, the heater pattern of the present invention is preferably such that at least one divided electric current lane extends continuously from one folded-back section to an immediately downstream folded-back section without merging with other divided electric current lane; and also more preferably each divided electric current lane extends through an even number of folded-back sections.

Furthermore, the heater pattern of the present invention is characteristic in that the electric current passage is divided into two or more lanes, the division extending continuously from a folded-back section immediately downstream from one electric power supply terminal to a folded-back section immediately upstream to the other electric power terminal, along the electric current passage; also it is more preferable that the said two or more divided lanes extend beyond the terminal folded-back sections as close to the respective electric power supply terminals as possible.

The three-dimensional ceramic heater of the present invention is preferably in the shape of a cylinder, a bottomed container, a boat or a half-pipe; and in the case of a cylindrical ceramic heater it is preferable that the irregularity of the diameter as measured between the outermost faces of the cylindrical heater is within a range of plus/minus 0.025 mm.

The supporting base body of the present invention is made of a pyrolytic boron nitride, and the heating element is preferably made of either a pyrolytic graphite or a pyrolytic graphite containing boron and/or boron carbide, and the insulating layer is preferably made of a pyrolytic boron nitride or a pyrolytic boron nitride containing carbon.

Further, it is preferable that the ceramic heater of the present invention is used in a vacuum vapor deposition apparatus in which a crucible containing a single source material for vapor deposition selected from Ag, Al, Au, Cr, Cu, Ga, Ge, In, and Si is heated to a temperature of 1000 degrees centigrade or higher whereby the source material is melted or sublimated.

Effects of the Invention

According to the present invention, it is possible to mitigate the localized extra heating at the folded-back sections of the heater pattern, and also to prevent any divided electric current lane from being heated to outstandingly higher temperature than other lanes for the irregularity in the temperature to which each divided electric current lane is heated is suppressed, so that it is possible to provide a three-dimensional ceramic heater made of PG/PBN which has a long life in the service of heating the raw material-holding crucible in a vacuum deposition apparatus.

BRIEF EXPLANATION OF THE DRAWINGS

FIG. 9 shows photographs taken of the external appearance of respective folded-back section of the heater pattern of the ceramic heaters according to Example 1, Comparative Example 1 and Comparative Example 2, to show the heating climate of them.

EXAMPLES EMBODYING THE INVENTION

We will now explain an embodiment of the present invention, but the invention is not limited thereto.

The ceramic heater of the present invention is a three-dimensional PG/PBN ceramic heater having a shape of a cylinder, a bottomed container, a boat or a half-pipe, and the most suitable shape is selected in response to the shape of the raw material-holding crucible to be heated.

The ceramic heater of the present invention comprises a supporting base body made of an electrically insulating ceramic and an electrically conductive ceramic formed on the supporting base body, and this conductive ceramic constitutes a thin film heating element in the form of a heater pattern having folded-back sections. Also, on this heating element is laid an insulating layer made of an electrically insulating ceramic, and electric power supply terminals are provided to connect the heating element to the power source.

Figure 1:
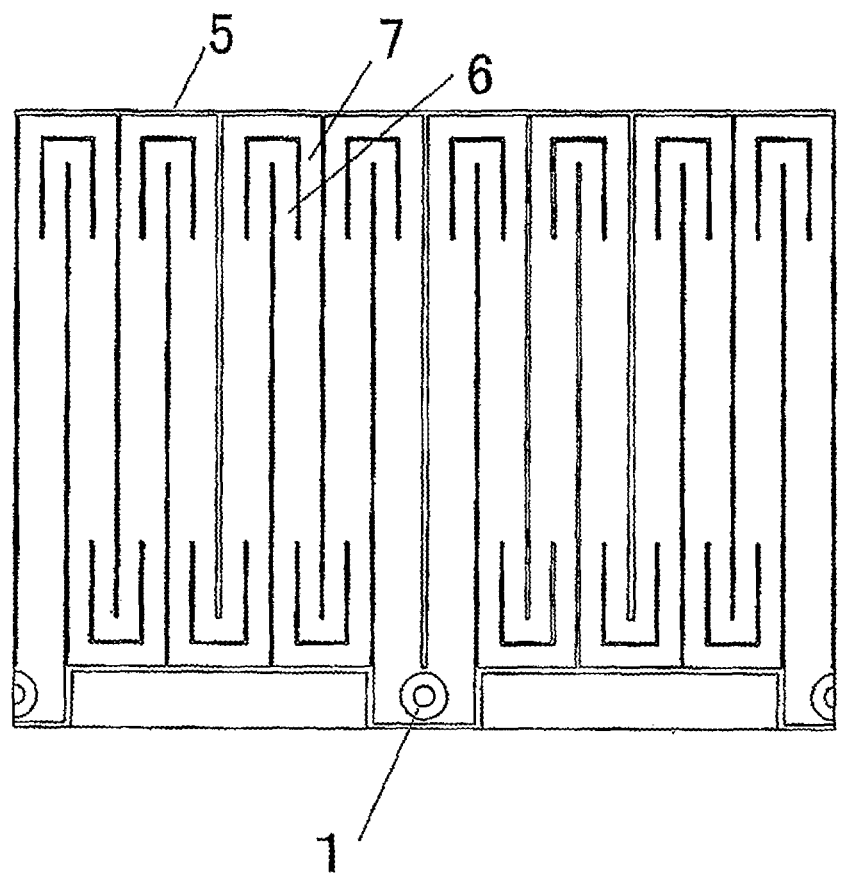
FIG. 1 is an unfolded view of a heater pattern of a ceramic heater according to an embodiment of the present invention.
Figure 2:
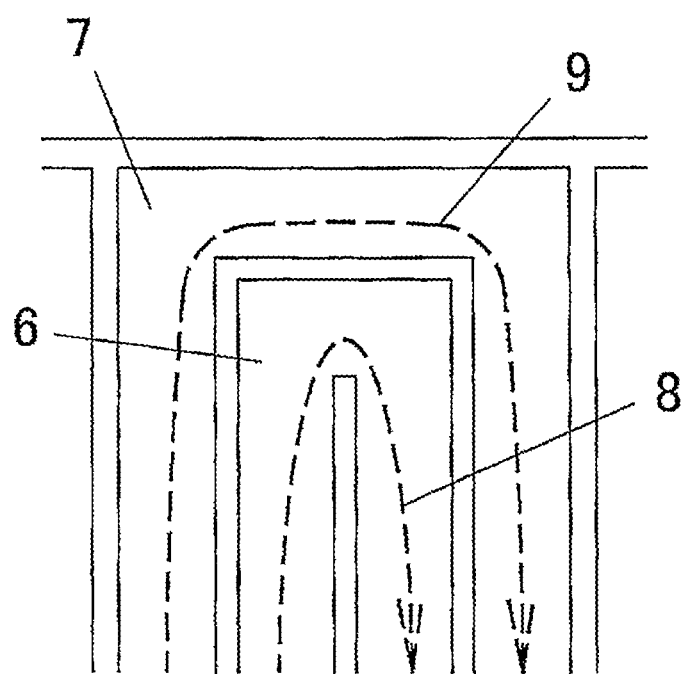
FIG. 2 is an enlarged view of a folded-back section of a heater pattern of a ceramic heater of the present invention, showing electric current lanes.

FIG. 1 is an unfolded view of a heater pattern of a ceramic heater of the present invention, in which each one of folded-back sections 5 of the heater pattern between a power supply terminal 1 and the other power supply terminal 1 is divided into two lanes an inner electric current lane 6 and an outer electric current lane 7. How the electric current flows in this heater pattern will be explained with reference to FIG. 2. FIG. 2 is an enlarged view of a folded-back section of the heating element which is divided in two lanes which extend along the direction of the current flow passage, and the curved broken lines indicate courses that electric current may take in the respective lanes 6, 7. Now, the electric current which flows in the heating element is divided into a branched current 8 which runs in the inner electric current lane 6 and a branched current 9 which runs in the outer electric current lane 7, so that the tendency of the electric current concentrating at the inner-most part of the folded-back section, which causes localized extra heating, is mitigated.

However, in this heater pattern the length of the inner electric current lane 6 is shorter than that of the outer electric current lane 7 so that the resistance of the inner electric current lane 6 is smaller than that of the outer electric current lane 7. Accordingly, in the heater pattern of FIG. 1, although the densification of the electric current at the inner-most part of the folded-back section is mitigated, the amount of the electric current that collects in the inner electric current lane 6 becomes greater; therefore there is still room for improvement to mitigate the densification of the electric current.

Figure 3:
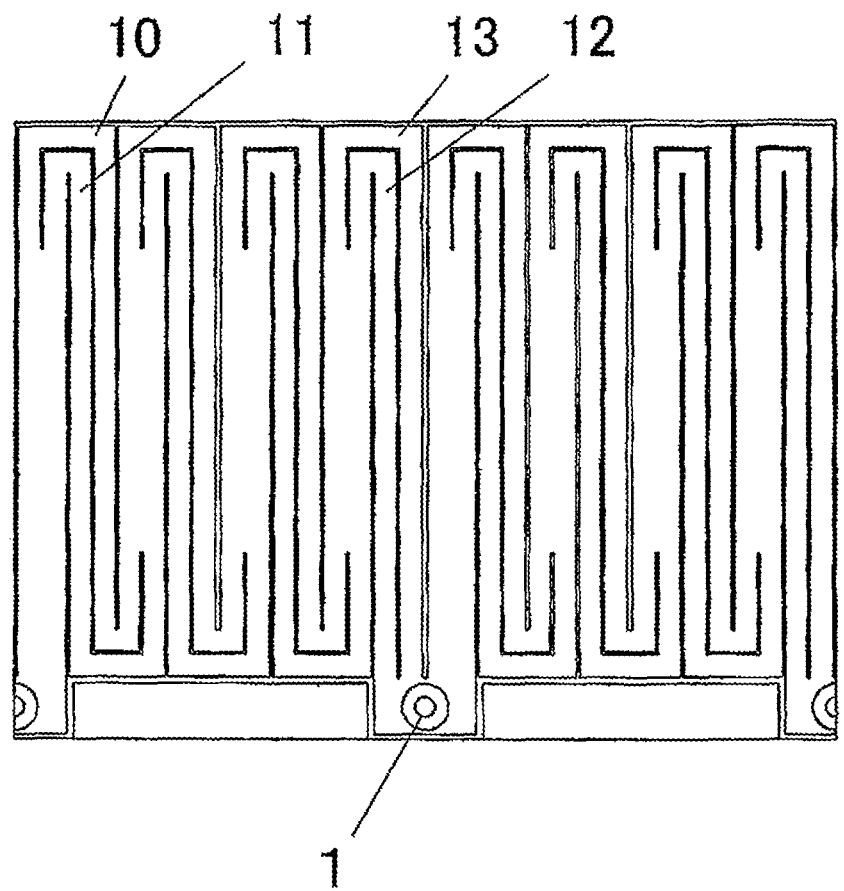
FIG. 3 is an unfolded view of a heater pattern of a ceramic heater according to another embodiment of the present invention.

Hence, if the heater pattern is divided into lanes with divisional line(s) extending continuously through an even number of consecutive folded-back sections such that each lane does not merge with another lane, it is possible to further reduce the localized extra heating. FIG. 3 shows such an improved example wherein the heater patter is divided into two lanes 10 and 11, which extend continuously through two consecutive folded-back sections along the electric current flow passage without merging with each other.

When the number of the consecutive folded-back sections through which the divided electric current lanes extend is an even number, the length of the divided electric current lanes become identical so that there is virtually no difference in the resistivity among the divided electric current lanes and thus the amount of electricity that flows in each lane becomes almost identical with a result that the prevention of the localized extra heating at the inner corner of each folded-back section of the heater pattern is more effectively effected.

In contrast to this, the electric current lane 12 and the electric current lane 13 extend through an even number of the folded-back sections along the electric current passage, there occurs difference in resistivity between the electric current lane 12 and the electric current lane 13. In this kind of situation, it is preferable that the divided electric current lanes are extended as close to an electric power supply terminal, as shown in FIG. 3, so that the effect of the difference in resistivity that occurs between the inner side lane and the outer side lane in the folded-back section is relatively mitigated.

Further, from the same reasoning as the case of FIG. 3, since the electric current passage of the heater pattern extends continuously from a folded-back section immediately downstream from one electric power supply terminal to a folded-back section immediately upstream to the other electric power terminal, it is well if the division of the electric current passage into two or more lanes continuously extends from the folded-back section neighboring the said one electric power terminal to the folded-back section neighboring the said other electric power terminal along the electric current passage, whereby the localized extra heating is further more suppressed.

Figure 4:
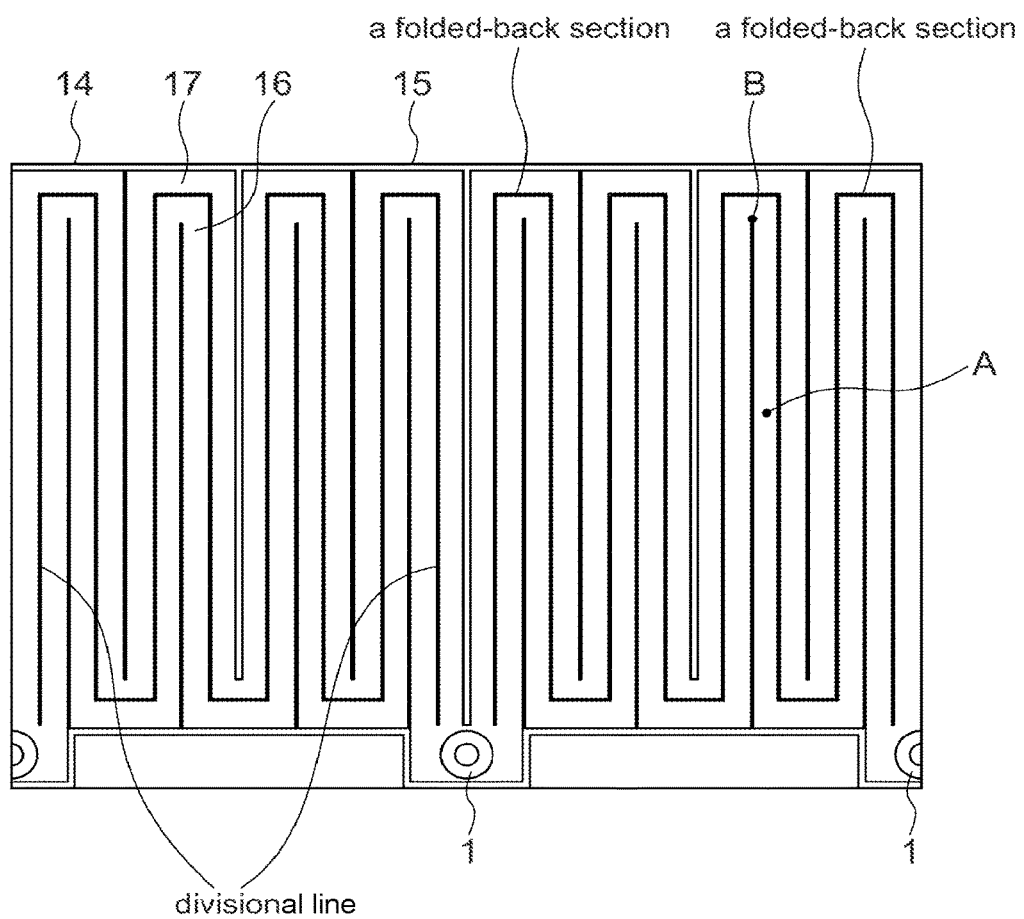
FIG. 4 is an unfolded view of a heater pattern of a ceramic heater according to a still another embodiment of the present invention, which is described in Example 2 hereunder.

FIG. 4 shows an improved example wherein a divisional line of the electric current passage into an electric current lane 16 and an electric current lane 17 extends continuously from a folded-back section 14 immediately downstream from one electric power supply terminal to a folded-back section 15 immediately upstream to the other electric power supply terminal 1.

As is the case with this improved example, if the division of the electric current passage extends continuously, even if the number of the folded-back sections through which the division extends is not an even number, the difference in resistivity between the divided electric current lanes is small thanks to the extensive length of the divided lanes, so that the prevention of the localized extra heating is well effected.

As is shown in FIG. 4, the electric passage is further divided into two lanes along its lengths between one electric power supply terminal and the immediately downstream folded-back section 14 and between the other electric power supply terminal and the immediately upstream folded-back section 15, so that the difference in resistivity between the electric current lane 16 and the electric current lane 17 is made smaller.

It is preferable that the electric passage is divided in such a manner that the widths of the resulting electric current lanes are identical to each other, but this is not essential. For if it is desired to control the temperature distribution of the ceramic heater with precision, it may be appropriate to differ the widths of the lanes from each other if need be, or it may be adequate to vary the width of an individual lane from place to place.

Figure 5:
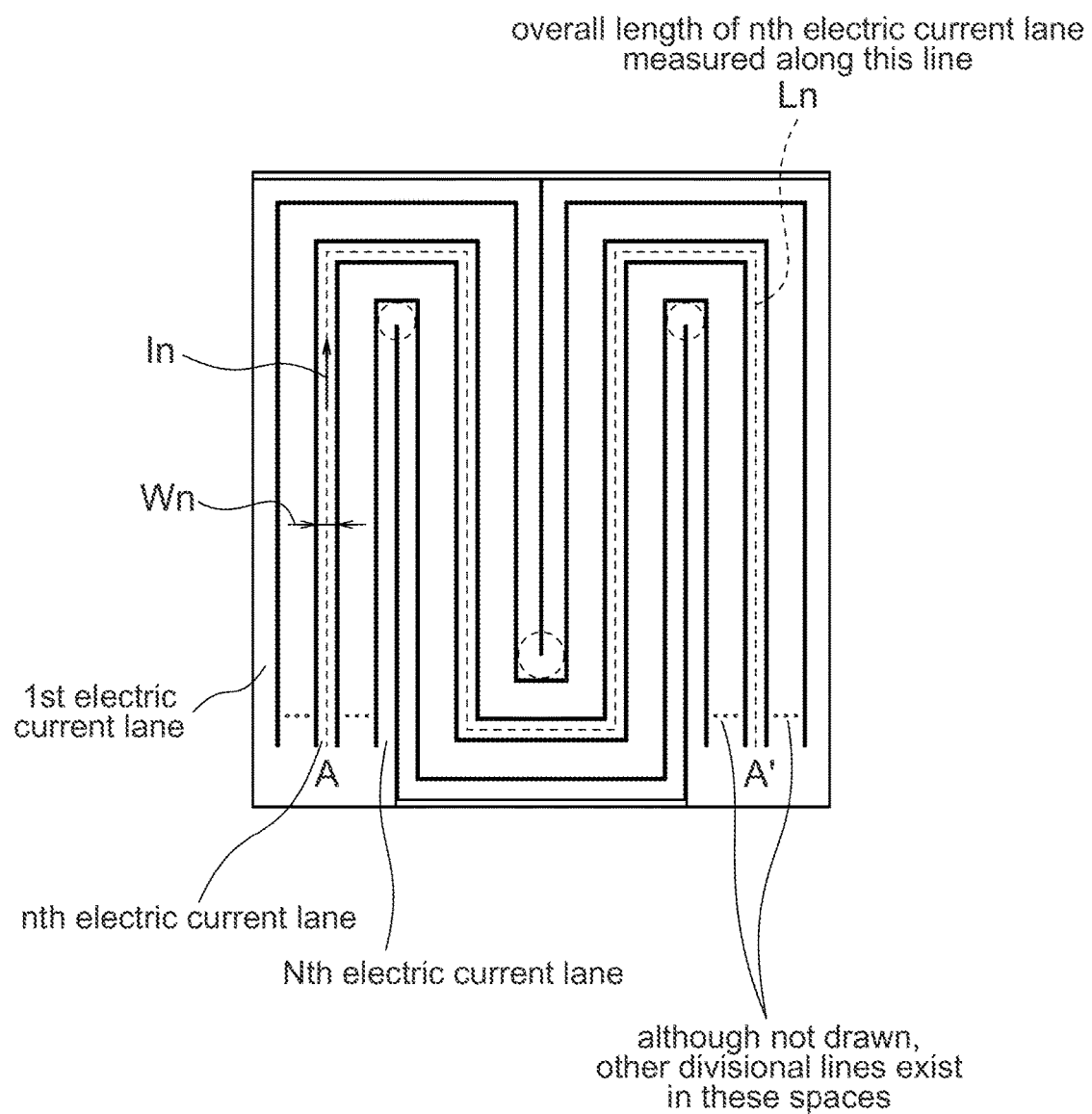
FIG. 5 is a schematic drawing to explain about the electric power density in the respective divided electric current lanes.
Figure 6:
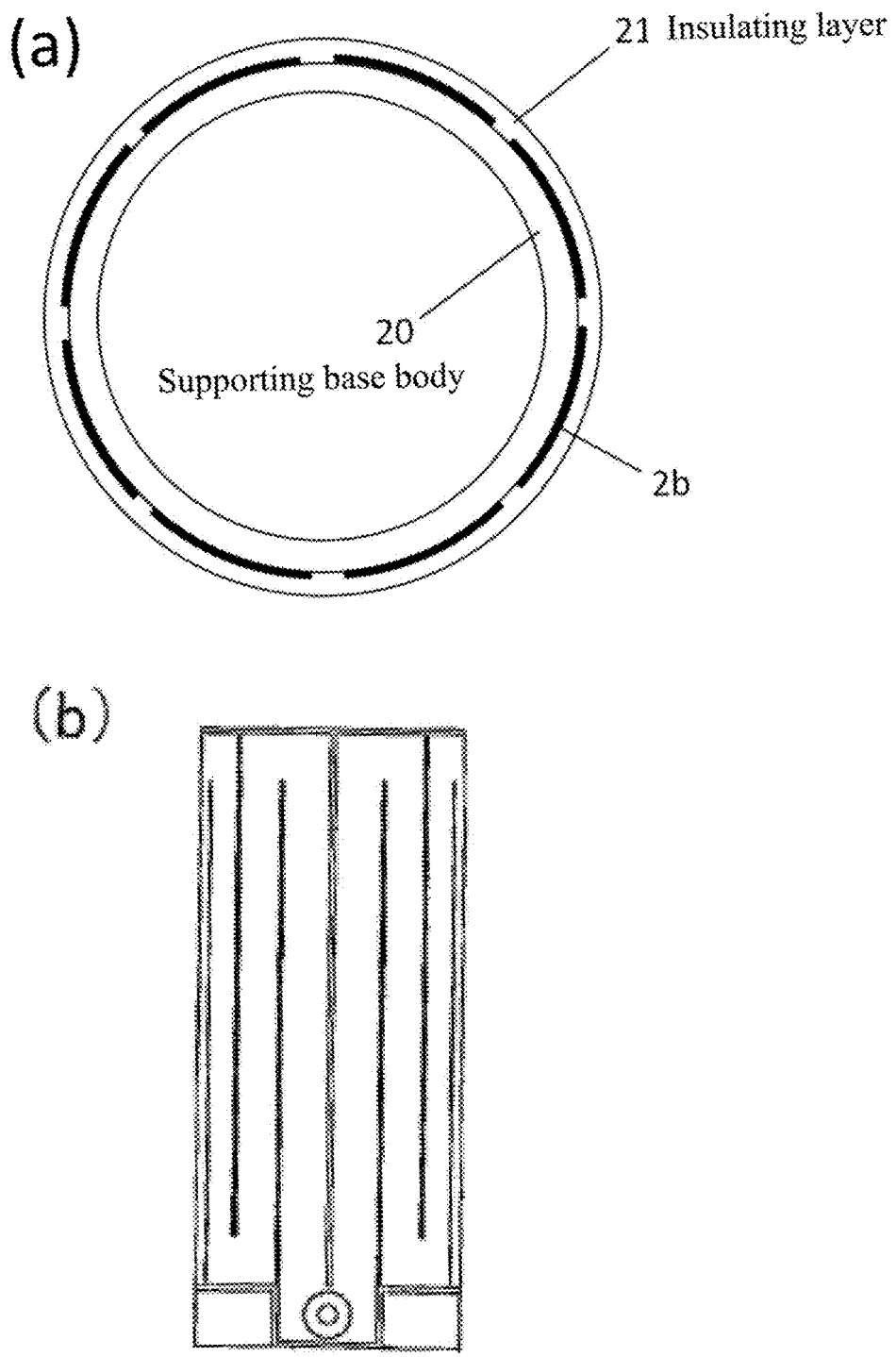
FIG. 6 is a plan view and a side view of a three-dimensional ceramic heater according to a Comparative Example.

Next, we will explain about the current density in respective electric current lanes into which the current passage is divided, referring to FIG. 5. FIG. 5 is a schematic drawing showing a situation in which the electric current passage is divided into N rows of lanes. The temperature of the ceramic heater is determined by the electric power density (power consumption per unit area), so that the greater the electric power density is, the higher the temperature becomes at the area, the smaller the electric power density is, the lower the temperature becomes at the area. For example, in the case of a heater pattern shown in FIG. 5, the following relations hold with respect to the nth electric current lane, wherein $P_n$, $R_n$, $S_n$ and $Z_n$ are, respectively, the electric power, the resistivity, the area, and the electric power density in the nth electric current lane:

$$P_n = V \times I_n = V^2/R_n;$$

$$R_n = \rho \times L_n/W_n \times T;$$

$$S_n = W_n \times L_n;$$

$$X_n = P_n/S_n;$$

wherein,
In: the current flowing in the nth electric current lane;
Ln: the overall length of the nth electric current lane (as measured along the broken line);
Wn: the width of the nth electric current lane;
V: the voltage as measured between the terminals A and A' of the divided electric current lane;
T: the thickness of the heating element;
$\rho$: the resistivity of the heating element.

Accordingly from the above relations, the electric power density Xn in the nth divided electric current lane is obtained by the following equation.

$$Xn = Pn/Sn = (V^2 \times T/\rho) \times 1/Ln^2.$$

Incidentally, when a ceramic heater is used to heat a raw material-holding crucible in a vacuum deposition apparatus, the ceramic heater's temperature is raised to as high as about 1300 degrees centigrade, so that if the temperature irregularity exists between the electric current lanes, the life of the ceramic heater is adversely affected. Hence, in the present invention, measures are taken to contain the current density in each electric current lane within a certain range so as to suppress the occurrence of temperature irregularity among the divided electric current lanes In particular, by dividing a section of a heating element into N rows of electric current lanes (N is 2 or larger) and restricting the electric power density in each divided electric current lane to a range of plus/minus 30% of the average of the electric power densities of the first to Nth lanes, it is possible to minimize the temperature irregularity among the lanes as well as the outstandingly high temperature heating in any particular electric current lane, and it is possible to mitigate the localized extra heating in the folded-back sections included in said section of the heating element, with the result that the life of the ceramic heater is significantly lengthened.

Therefore, the present invention is characterized by that at least a section of an electric current passage is divided into N rows of lanes (N is 2 or larger), and that the electric power density Xn in the nth lane (n is 1 to N) satisfies the following inequality. The effect of this invention is clear from the results of the Example 1 and Comparative Example 1, which will be described herein-below.

$$0.7 \leq \frac{Xn}{\frac{\sum_{n=1}^{N} Xn}{N}} \leq 1.3 \qquad \text{[Inequality 1]}$$

If the ratio of the electric power density in any of the lanes to the average value, as calculated from the above inequality 1, is 1.3 or greater, the temperature irregularity among the electric current lanes occurs more readily, and consequently the life of the ceramic heater is severely affected. Also as shown in FIG. 5, if the first or the nth electric current lane includes an inner-most part of a folded-back section of the heater pattern, as is indicated by broken-line circles, an abnormal over-heating is caused by densification of the electric current at the inner-most part of the folded-back section whereby the insulating layer in the inner-most part may be dissipated, causing the heating element to be broken. On the other hand, if the said ratio is 0.7 or smaller at any lane, the temperature irregularity among the divided electric current lanes is similarly promoted, and the life of the ceramic heater is severely shortened too.

Next, in a case wherein the supporting base body made of an insulating ceramic of the present invention is of a cylindrical shape and the irregularity in the diameter of the cylindrical outer side face of the supporting base body is within a range of plus/minus 0.025 mm, if the heater pattern is formed by applying an end mill to the thin film conductive ceramic layer laid on the surface of the supporting base body, the edge of the end mill enters the supporting base body by an approximately constant depth so that there is little fear that the mill edge cut in too far to form an overly deep groove, with a result that the insulating layer made of an electrically insulating ceramic provided over the heater pattern becomes hard to detach.

Also, if the irregularity in the diameter of the cylindrical outer side face of the supporting base body is within the range of plus/minus 0.025 mm, when the heater pattern is formed by applying an end mill to the thin film conductive ceramic layer laid on the surface of the supporting base body, the edge of the end mill enters the supporting base body by an approximately constant depth so that the width of the cut grooves becomes uniform and thus the width of the heating element also becomes uniform with a result that locally extra heated areas are rarely created.

Furthermore, if the irregularity in the diameter of the cylindrical outer side face of the supporting base body is within the range of plus/minus 0.025 mm, when the heater pattern is made in a manner such that a mask cut in a desired heater pattern is applied and sand is blasted upon the mask to thereby grave out the heater pattern, it becomes easy to apply the mask without distortion so that the resulting width of the grooves becomes fairly uniform and thus the width of the heating element becomes uniform too with a result that there is formed little locally extra heated area, and since the neighboring heating element parts are not formed too close to each other the occurrence of short circuit is prevented too.

The supporting base body of the electric insulating ceramic of the present invention is preferably made by chemical vapor deposition of pyrolytic boron nitride. The supporting base body made of this material can be used stably in a high temperature heating process of temperatures in the vicinity of 1500 degrees centigrade, and also in a heating process of a temperature rise at a rapid rate of 100 degrees centigrade per minute or faster. It is preferable that the thickness of the supporting base body is 0.5 through 2 mm, and more preferably 0.8 through 1.3 mm. If the thickness of the supporting base body is smaller than 0.5 mm, there is a high possibility that the supporting base body is damaged by a worker handling it, and if its thickness is greater than 2 mm, the time required for the formation of the supporting base body by the chemical vapor deposition method becomes so long that the cost becomes not justifiable.

One the other hand the thin film heating element of an electrically conductive ceramic is preferably made of either a pyrolytic graphite or a pyrolytic graphite containing boron and/or boron carbide, which (graphites) are prepared by chemical vapor deposition method. A heating element made of these materials can be used stably at high temperatures; and since they are prepared by chemical vapor deposition method, they have higher purities and can form a layer of a uniform thickness with higher precision than in the case in which a heating element layer is formed over the ceramic heater surface by screen printing of a conductive paste, which is the commonly adopted method. The thickness of the heating element is not specified in the present invention, and it can be appropriately determined in view of the combination of the factors such as the target heating temperature, the area to be heated, the capacity of the power source and the shape of the heater pattern. Preferably it is 10-300 micrometers, and more preferably 30-150 micrometers.

The insulating layer of an electrically insulating ceramic is preferably made of a pyrolytic boron nitride or a pyrolytic boron nitride containing carbon, which (nitrides) are prepared by chemical vapor deposition method. Such insulating layer can stably perform in a high temperature heating process of about 1500 degrees C. and also in a quick heating and cooling process of a rate of 100 degrees per minute. The thickness of the insulating layer is not specified in the present invention, while 20-300 micrometers is good, and 50-200 micrometers would be better, for when the thickness of the insulating layer is smaller than 20 micrometers, there is a possibility of dielectric breakdown, and when it is greater than 300 micrometers, the layer could detach easily.

The ceramic heater of the present invention is constructed as described above, so that it can perform stably for a long period of time even in a high temperature heating process where heated temperature may be 1000 degrees centigrade or higher. Also, when it is used to heat a crucible in a vacuum vapor deposition apparatus to melt or sublimate a source material for vapor deposition such as Ag, Al, Au, Cr, Cu, Ga, Ge, In, and Si, it performs trustworthily for a long period of time.

EXAMPLES

Example 1 (Not Claimed)

In Example 1, a pyrolytic boron nitride circular plate measuring 140 mm in diameter and 1 mm in thickness was made by reacting 4 slm (standard liter per minute) of ammonia with 2 slm of boron trichloride at a pressure of 10 Torr and a temperature of 1900 degrees centigrade. Next, a pyrolytic graphite layer of 50-micrometer thickness was formed on the circular plate by thermally cracking methane at a pressure of 5 Torr and a temperature of 1750 degrees centigrade; this layer was machine-cut into a heater pattern consisting of 8-mm-wide passages of heater element arranged to meander in the radial direction. As is seen in FIG. 9 (a), a pair of folded-back sections formed in the heater pattern are each divided—from a position E, at which the two folded-back sections face each other, through to a position 30 mm away from the position E—into two 4-mm-wide electric current lanes 18 and 19, the lane 18 being the inner lane at the folded-back section and the lane 19 being the outer lane thereat. Over this ceramic heating element was deposited a pyrolytic boron nitride insulating layer by reacting 5 slm of ammonia with 2 slm of boron trichloride at a pressure of 10 Torr and a temperature of 1890 degrees centigrade, and thus a ceramic heater was completed. With respect to this ceramic heater of Example 1, the ratio of the electric power density, as defined in Inequality 1 above, was calculated; the ratio of the electric power density of the inner lane 18 was 1.30 and that of the outer lane 19 was 0.70, thus they satisfied the Inequality 1 of the present invention.

Next, this ceramic heater was set in a vacuum chamber, and a thermo couple was attached to the heater for temperature measurement; thereafter, the interior of the chamber was evacuated to 1 Pa with a vacuum pump. Then the ceramic heater was electrified (electrically energized) and raised to a temperature of 1000 degrees centigrade. FIG. 9 (a) is a photo taken of the folded-back sections of the ceramic heater when the temperature was rising to 1000 degrees centigrade; as, at the folded-back sections, the current running through the heating element bifurcates into the inner current lane 18 and the outer electric current lane 19, and it is thought therefore that there occurred no localized heating in the innermost area of the folded-back sections.

Comparative Example 1

In Comparative Example 1, a ceramic heater was manufactured in the same manner as in Example 1; as is seen in FIG. 9 (b), a pair of folded-back sections are each divided—from a position F, at which the two folded-back sections face each other, through to a position 15 mm away from the position F—into inner and outer electric current lanes (18, 19). With respect to this ceramic heater of Comparative Example 1, the ratio of the electric power density, as defined in Inequality 1 above, was calculated; the ratio of the electric power density of the inner lane was 1.56 and that of the outer lane was 0.44, thus they did not satisfy the Inequality 1 of the present invention.

Next, this ceramic heater was set in the vacuum chamber, and the thermo couple was attached to the heater for temperature measurement; then, the interior of the chamber was evacuated to 1 Pa with the vacuum pump. Then the ceramic heater was electrified and raised to a temperature of 1000 degrees centigrade. FIG. 9 (b) is a photo taken of the folded-back sections of the ceramic heater when the temperature was being raised to 1000 degrees centigrade; at the folded-back sections, the current running through the heating element bifurcates into the inner electric current lane (18) and the outer electric current lane (19); however, the amount of the current that flows in the inner current lane (18) was much greater than that of the current that flows in the outer current lane (19) and it is thought therefore that there occurred localized heating in the innermost area of the left folded-back section (as indicated by an arrow).

Comparative Example 2

In Comparative Example 2, a ceramic heater was manufactured in the same manner as in Example 1; however, as is seen in FIG. 9 (c), no dividing was conducted on a pair of folded-back sections. Then, this ceramic heater was set in the vacuum chamber, and the thermo couple was attached to the heater for temperature measurement; then, the interior of the chamber was evacuated to 1 Pa with the vacuum pump. Then the ceramic heater was electrified and raised to a temperature of 1000 degrees centigrade. FIG. 9 (c) is a photo taken of the folded-back sections of the ceramic heater when the temperature was being raised to 1000 degrees centigrade; the current running through the heating element concentrated toward the innermost parts of the folded-back sections and it is thought therefore that there occurred localized heating in the innermost area of the left folded-back section (as indicated by an arrow).

Example 2

In Example 2, a pyrolytic boron nitride circular cylinder measuring 85 mm in outer diameter, 200 mm in height and 1.3 mm in thickness was made by reacting 4 slm of ammonia with 2 slm of boron trichloride at a pressure of 10 Torr and a temperature of 1900 degrees centigrade. Next, a pyrolytic graphite layer of 40-micrometer thickness was formed on the circular cylinder by thermally cracking methane at a pressure of 5 Torr and a temperature of 1750 degrees centigrade; this layer was machine-cut into a heater pattern as shown in FIG. 4. In this heater pattern the passage between the two electric power supply terminals 1, including the passage section between a folded-back section 14 and the closest electric power supply terminal and the passage section between the folded-back section 15 and the closest electric power supply terminal, was divided into an electric current lane 16 and an electric current lane 17, which extended continuously in parallel with the direction of the current flow. The widths of the electric current lanes 16 and 17 were both 7.3 mm, and the overall length of the electric current lane 16 was 141.9 cm and that of the electric current lane 17 was 145.2 cm.

Over this ceramic heating element was deposited a pyrolytic boron nitride insulating layer by reacting 5 slm of ammonia with 2 slm of boron trichloride at a pressure of 10 Torr and a temperature of 1900 degrees centigrade, and thus a ceramic heater was completed. With respect to this ceramic heater of Example 2, the ratio of the electric power density, as defined in Inequality 1 above, was calculated; the ratio of the electric power density of the electric current lane 16 was 1.02 and that of the lane 17 was 0.98, thus they satisfied the Inequality 1 of the present invention.

Next, this ceramic heater was set in the vacuum chamber, and the thermo couple was attached to the heater for temperature measurement; thereafter, the interior of the chamber was evacuated to 1 Pa with the vacuum pump. Then the ceramic heater was electrified and raised to a temperature of about 1400 degrees centigrade. The temperature distribution of the heater surface was measured using a thermograph (Neo Thermo TVS-700, a product name of Nippon Avionics Co., Ltd.), which peeped through the inspection window of the vacuum chamber, and it was found that the temperature of a point A in FIG. 4, which was not in a folded-back section of the heater pattern, was 1406 degrees centigrade; on the other hand the temperature of a point B, which is in the inner divided current lane at the folded-back section of the heater pattern, was 1396 degrees centigrade.

From this result, it was found that in the case of a cylindrical heater pattern in which the folded-back sections are divided into two lanes, there was not substantial temperature difference between the inner lane in the folded-back section and that at a location outside the folded-back sections, so that it was confirmed that the occurrence of localized temperature hike can be prevented by this designing of the heater pattern.

Comparative Example 3

Figure 7:
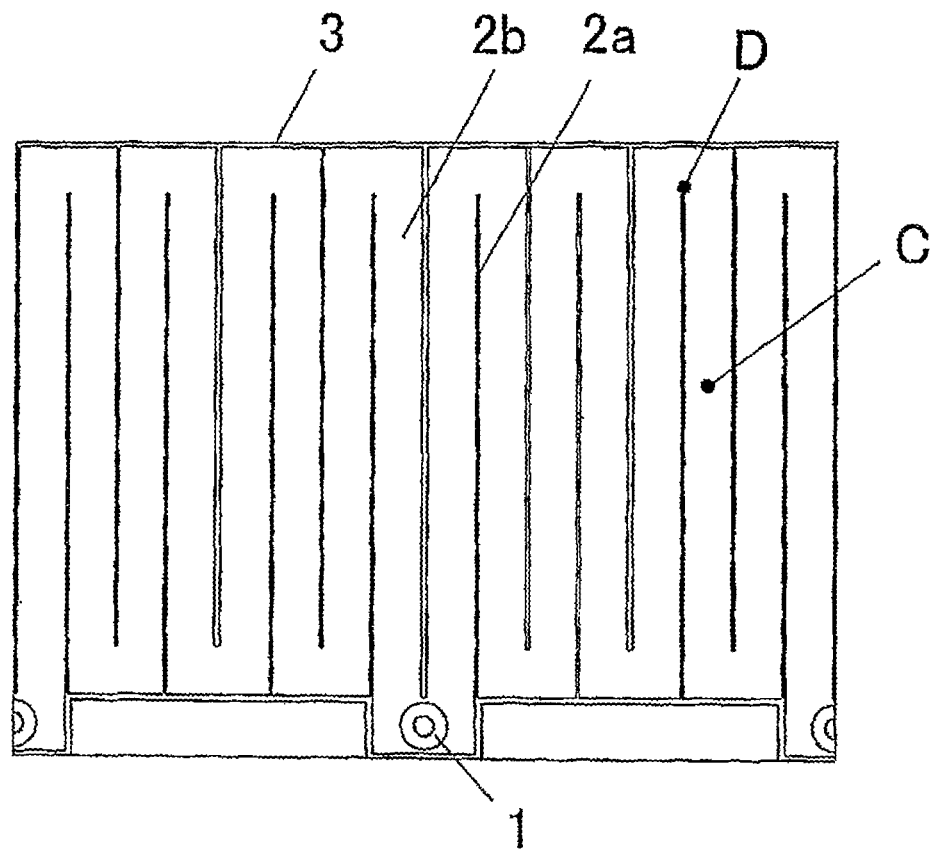
FIG. 7 is an unfolded view of a heater pattern of the ceramic heater according to the Comparative Example.
Figure 8:
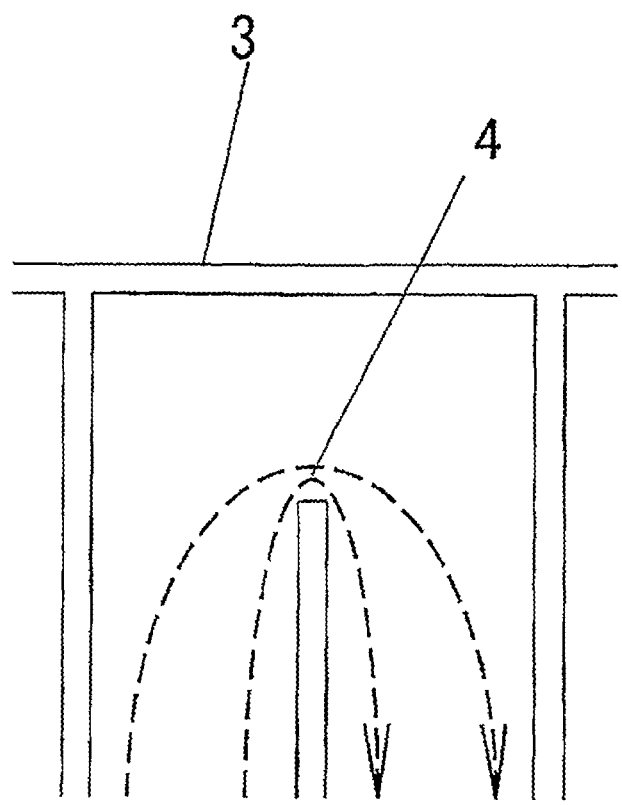
FIG. 8 is an enlarged view of a folded-back section of the heater pattern of the ceramic heater of the Comparative Example wherein the electric current lane is shown.

In Comparative Example 3, a pyrolytic boron nitride circular cylinder was manufactured in the same manner as in Example 2, and also a pyrolytic graphite layer was formed on the circular cylinder. This layer was machine-cut into a heater pattern as shown in FIG. 7. In this heater pattern although there are two passages between the two electric power supply terminals, each passage was not divided into lanes at the folded-back sections. As in Example 2, a pyrolytic boron nitride insulating layer was deposited over this ceramic heating element and thus a ceramic heater was completed.

Next, this ceramic heater was set in the vacuum chamber, and the thermo couple was attached to the heater for temperature measurement; thereafter, the interior of the chamber was evacuated to 1 Pa with the vacuum pump. Then this heater was electrified and raised to a temperature of 1400 degrees centigrade. The temperature distribution of the heater surface was measured using a thermograph (Neo Thermo TVS-700, a product name of Nippon Avionics Co., Ltd.), which peeped through the inspection window of the vacuum chamber, and it was found that the temperature of a point C, which was not in a folded-back section of the heater pattern, was 1402 degrees centigrade, and on the other hand the temperature of a point D, which is an innermost position at a folded-back section of the heater pattern, was 1561 degrees centigrade.

From this result, it was found that, in the case of a cylindrical heater pattern in which the folded-back sections were not divided into lanes, there occurred an abnormally high temperature localized heating at an innermost point of a folded-back section.

INDUSTRIAL APPLICABILITY

The ceramic heater of the present invention does not suffer a failure by local overheating, even at the most vulnerable innermost area of the folded-back sections, so that it can be used for a long time dependably and therefore is industrially very useful.

EXPLANATION OF THE REFERENCE NUMERALS

1: power supply terminal
2a: groove
2b: heating element
3, 5, 14, 15: folded-back section
4: inner corner of folded-back section
6, 11, 12, 16, 18: inner electric current lane
7, 10, 13, 17, 19: outer electric current lane
8, 9: electric current
20: supporting base body
21: insulating layer Scope of what is claimed:
1. A method for making a coated article by conducting a vapor deposition in a vacuum vapor deposition apparatus comprising a step of heating a crucible containing a deposition source material selected from Ag, Al, Au, Cr, Cu, Ga, Ge, In, and Si to a temperature of 1000 degrees centigrade or higher to thereby melt or sublimate said source material by using a three dimensional ceramic heater comprising:
   a supporting base body made of an electrically insulating ceramic, the supporting base body being in a shape of a cylinder;
   a thin film heating element made of a conductive ceramic, which is laid on said supporting base body and is cut to have a heater pattern including multiple folded-back sections,
   wherein the multiple folded-back sections are disposed in parallel to each other on a side surface of the supporting base body in the shape of a cylinder;
   an insulating layer made of an electrically insulating ceramic, which is laid over the heating element; and
   multiple power supply terminals disposed at a lower end of the supporting base body for connecting the heating element to a power source,
   wherein the heater pattern is divided at the multiple folded-back sections into two or more current lanes of the conductive ceramic by one or more divisional lines with no conductive ceramic, and
   wherein each one of said folded-back sections is divided into N electric current lanes with divisional lines which extend in directions of an electric current flow wherein N is two or more, and an electric power density Xn in an nth electric current lane satisfies an Inequality 1 (n being 1 through N)

$$0.7 \leq \frac{Xn}{\frac{\sum_{n=1}^{N} Xn}{N}} \leq 1.3. \qquad \text{[Inequality 1]}$$

2. The method for making a coated article according to claim 1, wherein said heater pattern is such that at least one divided electric current lane extends continuously from one folded-back section to an immediately downstream folded-back section without merging with another divided electric current lane.

3. The method for making a coated article according to claim 2, wherein said divided electric current lane extends continuously between a folded-back section immediately downstream from one power supply terminal and a folded-back section immediately upstream to the other power supply terminal inclusive without merging with another divided electric current lane.

4. The method for making a coated article according to claim 2, wherein said divided electric current lanes extend through an even number of folded-back sections continuously without merging with another divided electric current lane.

5. The method for making a coated article according to claim 2, wherein said divided electric current lane extends from a close vicinity of one power supply terminal to a close vicinity of the other power supply terminal continuously without merging with another divided electric current lane.

6. The method for making a coated article according to claim 1, wherein said supporting base body is of a cylindrical shape and an irregularity in diameter of cylindrical outer side face of the supporting base body is within a range of plus/minus 0.025 mm.

7. The method for making a coated article according to claim 1, wherein said supporting base body is made of a pyrolytic boron nitride, and said heating element is made of either a pyrolytic graphite or a pyrolytic graphite containing boron and/or boron carbide, and said insulating layer is made of a pyrolytic boron nitride or a pyrolytic boron nitride containing carbon.

* * * * *